(12) United States Patent
Wei et al.

(10) Patent No.: US 12,362,554 B2
(45) Date of Patent: Jul. 15, 2025

(54) POWER SUPPLY DEVICE

(71) Applicant: FSP TECHNOLOGY INC., Taoyuan (TW)

(72) Inventors: Lung-Chi Wei, Taoyuan (TW); Mao-Kuan Lin, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 196 days.

(21) Appl. No.: 18/184,461

(22) Filed: Mar. 15, 2023

(65) Prior Publication Data

US 2023/0299574 A1 Sep. 21, 2023

Related U.S. Application Data

(60) Provisional application No. 63/320,289, filed on Mar. 16, 2022.

(51) Int. Cl.
*H02H 7/12* (2006.01)
*H05K 7/14* (2006.01)

(52) U.S. Cl.
CPC ............. *H02H 7/12* (2013.01); *H05K 7/1432* (2013.01)

(58) Field of Classification Search
CPC ................................ H02H 7/12; H05K 7/1432
See application file for complete search history.

(56) References Cited

U.S. PATENT DOCUMENTS

| | | | | |
|---|---|---|---|---|
| 4,317,155 A * | 2/1982 | Harada | ..................... | H01T 1/00 313/643 |
| 5,227,944 A * | 7/1993 | Eggendorfer | ............. | H01T 1/15 361/126 |
| 5,572,406 A * | 11/1996 | Strang | ..................... | H05K 7/209 439/620.08 |
| 7,808,364 B2 * | 10/2010 | Chou | ..................... | H01C 7/126 338/21 |
| 8,125,308 B1 * | 2/2012 | Barton | ..................... | H01C 7/12 338/21 |
| 2008/0117555 A1 * | 5/2008 | Wilson | ................. | H05K 1/0256 361/13 |
| 2008/0258858 A1 * | 10/2008 | Sun | ........................ | H01C 1/144 29/613 |
| 2013/0278361 A1 * | 10/2013 | Weeks | ................... | H01H 13/20 335/6 |
| 2020/0203941 A1 * | 6/2020 | Ing | .......................... | H05K 1/118 |
| 2021/0135452 A1 * | 5/2021 | Roberts | ................. | H02H 3/167 |

* cited by examiner

*Primary Examiner* — Scott Bauer
(74) *Attorney, Agent, or Firm* — MUNCY, GEISSLER, OLDS & LOWE, P.C.

(57) ABSTRACT

A power supply device includes a conversion module, a plastic case and an inorganic material, and the conversion module includes an input end, a potential ignition source, a conversion circuit and an output end. The input end is configured to receive an input source, and the potential ignition source is configured to suppress a surge of the input source. The conversion circuit is configured to convert the input source into an output source, and the output end is configured to provide the output source to a load. The plastic case accommodates the conversion module, and the plastic case includes an inner surface. The inorganic material is configured between the potential ignition source and the inner surface, and a distance between the potential ignition source and the inner surface is less than 13 mm.

9 Claims, 9 Drawing Sheets

POWER SUPPLY DEVICE

CROSS-REFERENCE TO RELATED APPLICATION

This patent application claims the benefit of U.S. Provisional Patent Application No. 63/320,289, filed Mar. 16, 2022, which is incorporated by reference herein.

BACKGROUND

Technical Field

The present disclosure relates to a power supply device, and more particularly to the miniaturized power supply device with fire-retardant function.

Description of Related Art

In order to meet a requirement of portability, an existing power supply or an adapter (hereinafter referred to as a power supply device) has increasingly stringent requirements on a size of the power supply device, especially for the adapter of electronic equipment (such as mobile phones, notebooks, game consoles, etc.), the size of the adapter is a point of consideration for consumers. However, although a volume of the power supply device is reduced, its output power still needs to meet the requirements of the power supply device with the non-reduced size as before. Therefore, an internal power density of the power supply device is forced to increase, which greatly compresses a space for disposing electronic components. Among them, there are generally one to several potential ignition sources (PIS) inside the power supply device, for example but not limited to a varistor, a power switch and other components. Taking the varistor as an example, in order to prevent abnormalities or failures of the power supply device due to surges, protective components such as fuse and the varistor must be installed at the input end of the power supply device, so as to avoid impacting the components inside the power supply device or the load at the rear end.

In addition to the fuse, when the varistor has abnormal conditions such as surge at an input source, and the abnormal condition exceeds the withstand voltage/current specifications of the varistor, the varistor will burn out. Before the varistor is ready to be burn out, a large amount of heat and flames are usually generated, which may cause the entire power supply device to catch fire. For example, as shown in photographs of experimental results of the miniaturized power supply device without a fire-retardant function in a related art in FIGS. 1-2, after the varistor burns out due to abnormal conditions, it will affect external components such as a plastic case and a circuit board, resulting in a large-area burn through of the plastic case of the miniaturized power supply device 100. In this way, the flame may burn through the power supply device 100 and spread to the surrounding equipment to cause a risk of fire.

Therefore, it is a major topic for the inventors of the present disclosure to design a miniaturized power supply device with fire-retardant function to avoid the phenomenon that the plastic case of the miniaturized power supply device causes large-area burn through after the varistor burned out due to abnormal conditions.

SUMMARY

In order to solve the above-mentioned problems, the present disclosure provides a miniaturized power supply device with fire-retardant function. The power supply device includes a conversion module, a plastic case and an inorganic material, and the conversion module includes an input end, a potential ignition source, a conversion circuit and an output end. The input end is configured to receive an input source, and the potential ignition source is coupled to the input end to suppress a surge of the input source. The conversion circuit is coupled to the potential ignition source, and is configured to convert the input source into an output source. The output end is configured to provide an output source to the load to supply power to the load. The plastic case accommodates the conversion module, and the plastic case includes an inner surface. The inorganic material is configured between the potential ignition source and the inner surface of the plastic case, and a distance between the potential ignition source and the inner surface is less than 13 mm.

In one embodiment, the potential ignition source is a surge absorption unit.

In one embodiment, the inorganic material is a sticker, and is flexibly wrapped around the potential ignition source.

In one embodiment, the inorganic material is a baffle, and is configured between the potential ignition source and the inner surface.

In one embodiment, the inorganic material is a sticker, and is attached to the inner surface of the potential ignition source.

In one embodiment, the power supply device complies with an overload test of IEC 62368-1:2018 of international safety standards.

In one embodiment, the power supply device further includes a thermal fuse serially. The thermal fuse serially is coupled in series with the potential ignition source, and a distance between the thermal fuse and the potential ignition source is less than 8 mm.

In one embodiment, a fire resistance level of the inorganic material is UL 94 5VA.

In one embodiment, the inorganic material is a material of FRB series.

The main purpose and effect of the present disclosure is that, under the condition that it is difficult for the potential ignition source of the miniaturized power supply device to maintain a safe isolation distance (for example but not limited to, 13 mm of a limit of the international safety standards) from the plastic case, by arranging inorganic material between the potential ignition source and the case, the problem of flame burning through or spreading out when the potential ignition source burns out can be suppressed, and the plastic case will not be carbonized or brittle due to high temperature.

It is to be understood that both the foregoing general description and the following detailed description are exemplary, and are intended to provide further explanation of the present disclosure as claimed. Other advantages and features of the present disclosure will be apparent from the following description, drawings, and claims.

DETAILED DESCRIPTION

Figure 1:
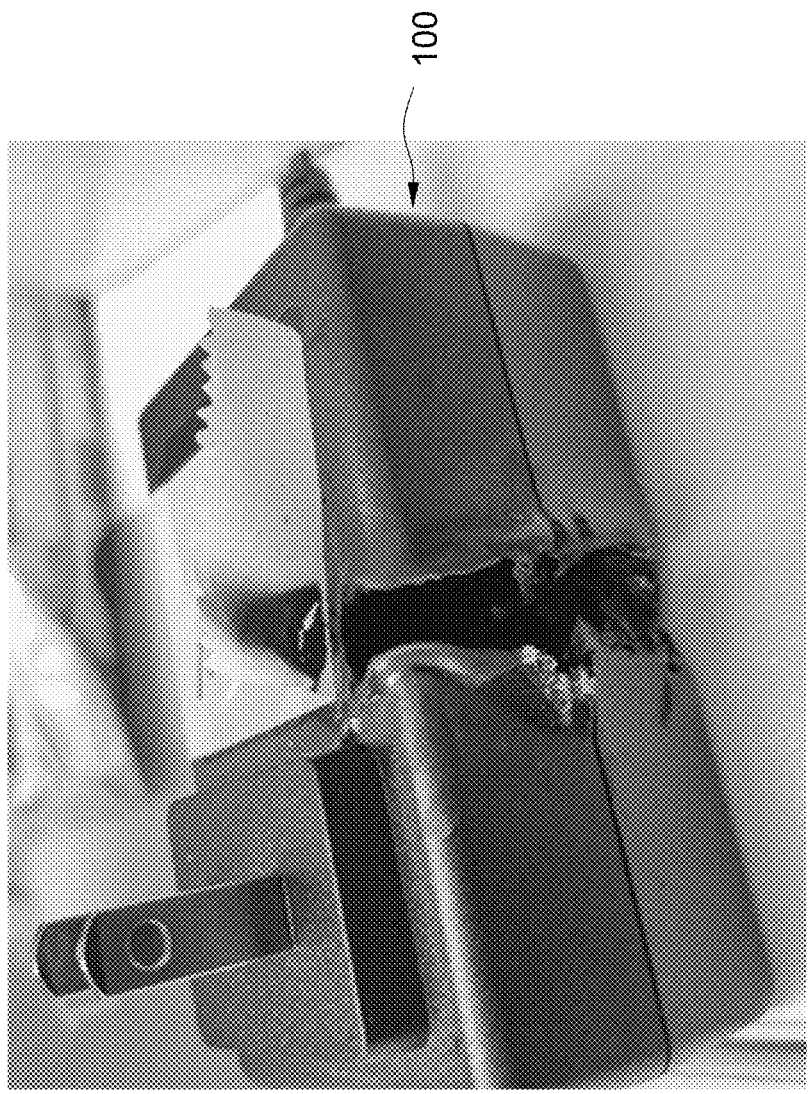
FIG. 1 is a photograph of experimental results of a first embodiment of a related art miniaturized power supply device without fire-retardant function.
Figure 2:
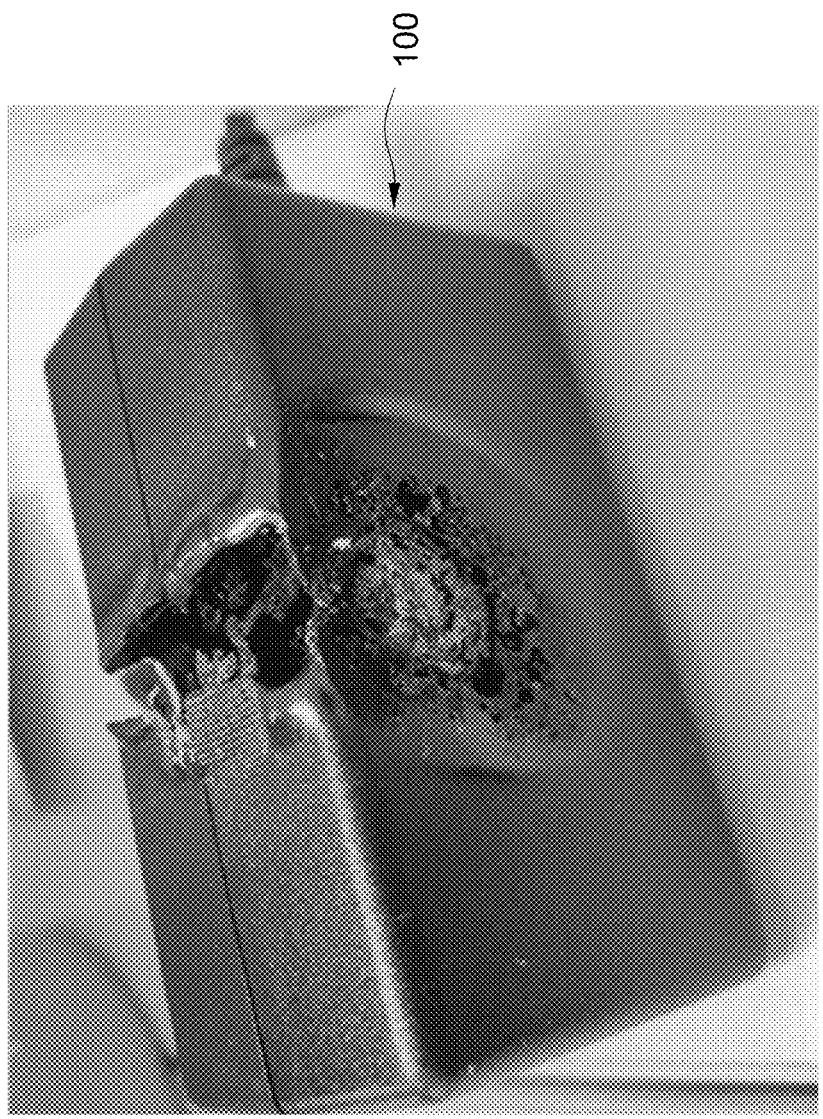
FIG. 2 is a photograph of experimental results of a second embodiment of the related art miniaturized power supply device without fire-retardant function.

Reference will now be made to the drawing figures to describe the present disclosure in detail. It will be understood that the drawing figures and exemplified embodiments of present disclosure are not limited to the details thereof.

Figure 3:
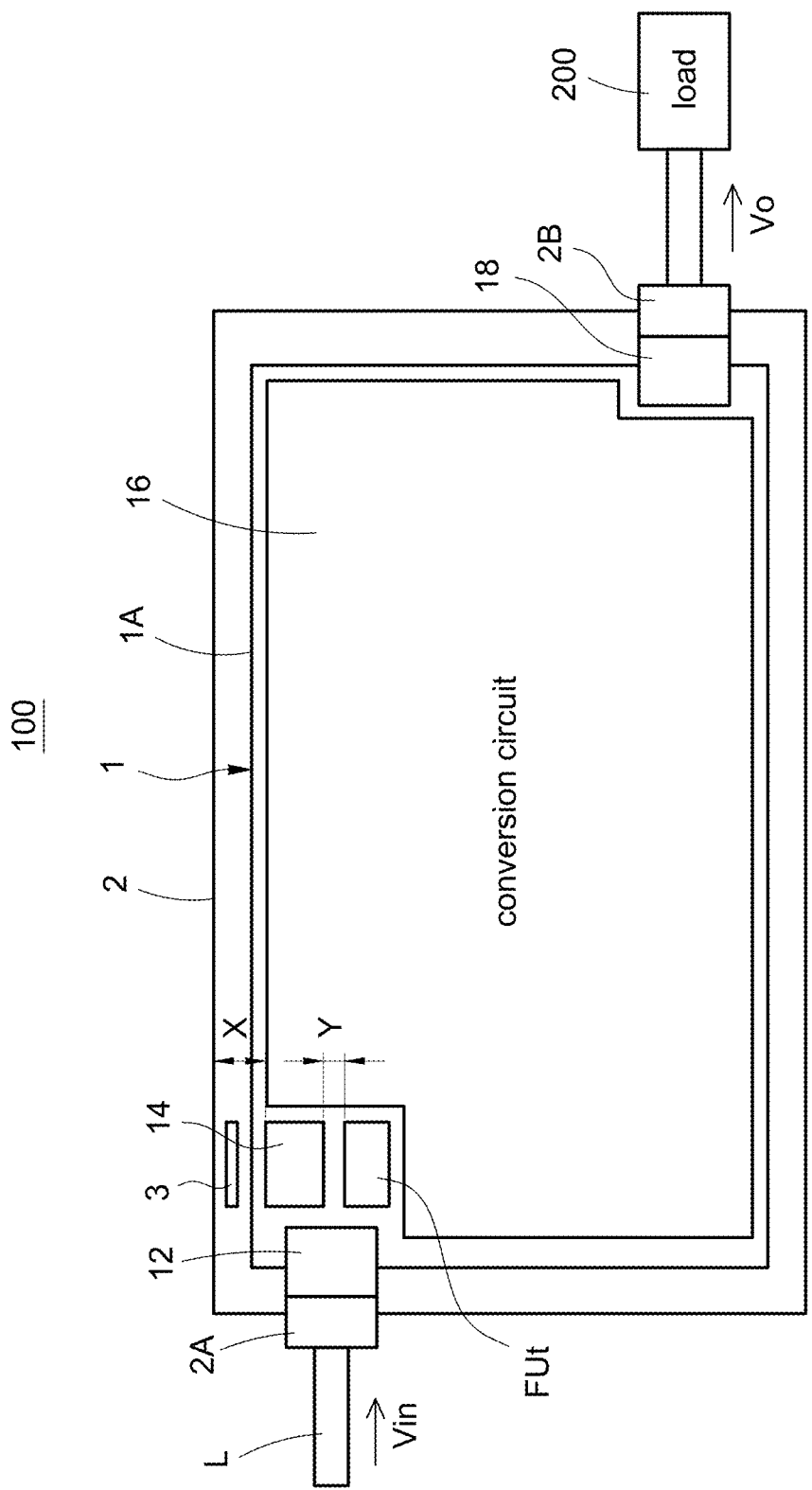
FIG. 3 is a schematic diagram of circuit configuration of a miniaturized power supply device with the fire-retardant function according to the present disclosure.

Please refer to FIG. 3, which shows a schematic diagram of circuit configuration of a miniaturized power supply device with the fire-retardant function according to the present disclosure. A power supply device 100 is coupled to a power line L and a load 200, and includes a conversion module 1 and a plastic case 2. The conversion module 1 can be configured on a circuit board 1A, and includes an input end 12, a potential ignition source 14 (may be referred to as PIS, for example but not limited to a varistor), a conversion circuit 16 and an output end 18. The input end 12 is used for coupling the power line L to receive an input source Vin provided by the power line L. The potential ignition source 14 is coupled to the input end 12 to suppress the surge of the input source Vin. The conversion circuit 16 is coupled to the potential ignition source 14 and converts the input source Vin into an output source Vo. The conversion circuit 16 may be a switchable conversion circuit such as an isolated type conversion circuit (for example but not limited to Flyback, Forward circuit) or a non-isolated type conversion circuit (for example but not limited to Buck, Boost circuit), and includes at least one power switch inside, so that the input source Vin is converted into the output source Vo by controlling switching on/off of the power switch. The output end 18 is coupled to the conversion circuit 16 and receives the output source Vo to provide the output source Vo to the load 200.

The plastic case 2 accommodates the conversion module 1, and has two ports 2A, 2B defined thereon, and the input end 12 and the output end 18 are respectively configured in one of the two ports 2A, 2B (for example but not limited to, the input end 12 is configured on the port 2A, and the output end 18 is configured on the port 2B). Wherein, a fire resistance level of the plastic case 2 is preferably V-0. On the other hand, the conversion module 1 may optionally include a temperature fuse FUt, and the temperature fuse FUt is coupled in series with the potential ignition source 14. The temperature fuse FUt is mainly used for sensing overheating generated in abnormal operation of the conversion module 1, and the path between the input end 12 and the potential ignition source 14 of the conversion module 1 is broken according to the overheating, so that fire disasters are avoided. In one embodiment of the present disclosure, the configuration position of the temperature fuse FUt shown in FIG. 3 is only for illustrative, and is not limited to the position shown in FIG. 3, it may be configured near the input end 12.

Figure 4:
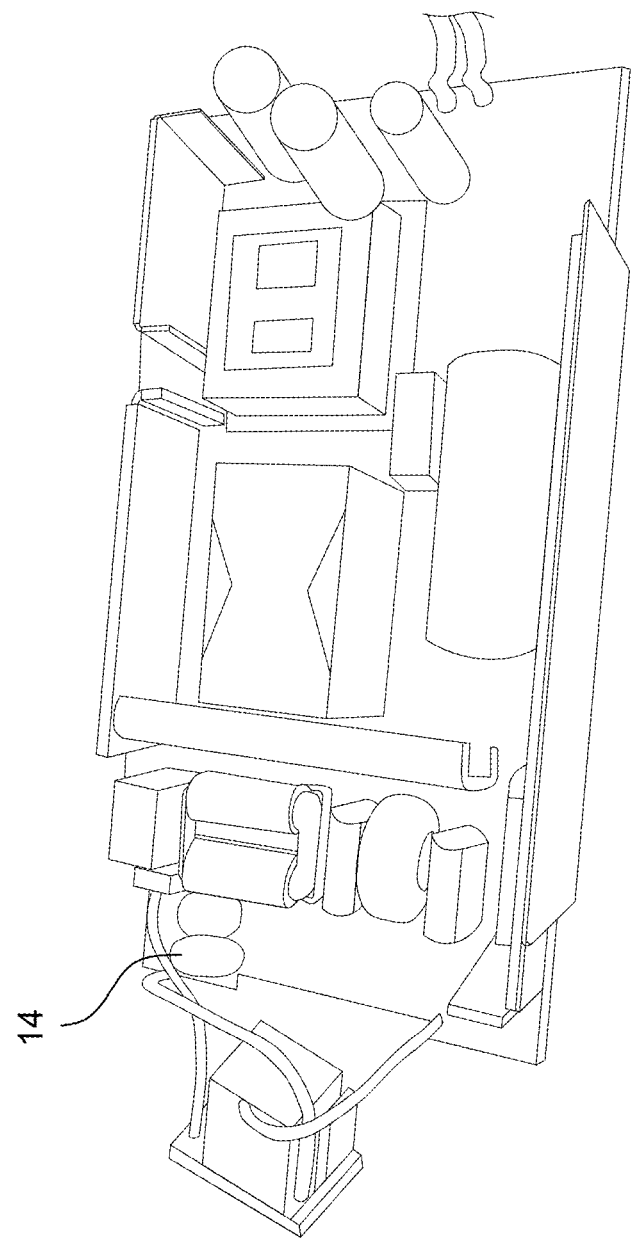
FIG. 4 is an internal configuration diagram of the miniaturized power supply device according to the first viewing angle of the present disclosure.
Figure 5:
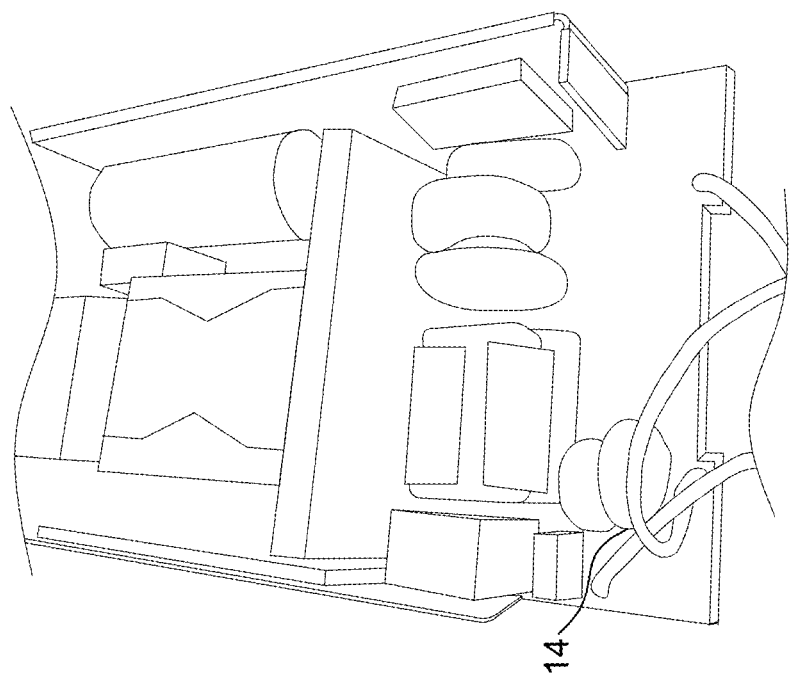
FIG. 5 is an internal configuration diagram of the miniaturized power supply device according to the second viewing angle of the present disclosure.

In general, it is necessary to avoid the phenomenon that the plastic case 2 of the miniaturized power supply device 100 is burnt through in a large area after the potential ignition source 14 (for example but not limited to the varistor) is burnt out due to abnormal conditions. Therefore, the power supply device 100 must pass a test of international safety standards (hereinafter referred to as safety standards) before leaving a factory, so as to comply with the safety standards. Specifically, under the safety standards of IEC 62368-1:2018, a potential ignition source 14 (the varistor) inside the power supply device 100 must keep a minimum distance of 13 mm from the plastic case 2, or use the plastic case 2 with a fire resistance level of V-0. However, due to a feature of high power density and narrow internal space of the miniaturized power supply device 100, the potential ignition source 14 usually cannot maintain the minimum distance of 13 mm from the plastic case 2. If there is a mylar film(s) or other parts in the middle of this distance, it is considered that this distance is not in compliance with the safety standards, and this component should not be used as an extension of this distance. The main reason is that the potential ignition source 14 is usually located very near to the input end 12, and their installation position is usually located on one side of the circuit board 1A, which is bound to be very close to the plastic case 2 of the power supply device 100. As shown in FIGS. 4 and 5, an internal configuration diagram of the miniaturized power supply device of the present disclosure is taken as an example, potential ignition source 14 beside the input end 12 cannot keep the distance of 13 mm from the plastic case 2 at all.

Therefore, it is necessary to add a flame-proof material between the plastic case 2 and the potential ignition source 14. However, the conventional flame-proof material is usually carbonized or brittle due to organic elements such as carbon contained in a material under instantaneous high temperature. In this way, the carbonized or embrittlement flame-proof material will have structural cracks or even fall off, causing the flame to still burn through or spread through from a damaged parts of these structures of the plastic case 2 due to carbonization (or embrittlement), and there is still a danger of flame spreading to other components or plastic case 2.

In order to solve the above problems, the current countermeasures to solve the above problems are as follows:

a. No varistor (i.e., the potential ignition source 14) is used in circuit design.

b. The varistor (i.e., the potential ignition source 14) is used in the circuit design, but a body of the varistor must keep the minimum distance of 13 mm from the plastic case 2.

c. The power supply device 100 uses a method of trial and error to randomly evaluate an overload specification and a transient overvoltage specification of the varistor (i.e., the potential ignition source 14) for the whole machine.

According to the above countermeasures a, the phenomenon that the power supply device 100 may cause abnormality or failure due to surge, and the fault risk is high. The above countermeasure b needs a large area of the circuit board 1A, which is not conducive to the miniaturization requirement of the power supply device 100. According to the above countermeasures c, each type of the fuse and each type of the varistor are matched with the plastic case 2 made of different materials, and cross-match to get all the combinations. For each combined sample, during the test, as long as the flame generated by the varistor does not burn the plastic case 2 before blows, the test of the safety standards is judged to be qualified. In this way, in order to increase the probability of test success, the varistor is forced to use a higher-level withstand voltage/current resistant model, or is forced to use a varistor with built-in temperature circuit breaker. However, any design adopting one or more of above countermeasures a, b and c will inevitably increase the complexity of the circuit design, or increase the circuit cost.

Since the power supply device 100 of the present disclosure is designed with miniaturization, has high power density, and a space inside the plastic case 2 is narrow, the conversion circuit 16 has occupied almost all the space on the circuit board 1A. Moreover, since the potential ignition source 14 (refers here to the varistor) is very near to the input end 12, its installation position is located on the side of the circuit board 1A and very close to the plastic case 2, and the distance between the potential ignition source 14 and the plastic case 2 cannot be kept at the minimum distance of 13 mm. In addition, if the conversion module 1 is further configured with the condition of the temperature fuse FUt, the temperature fuse FUt is usually configured between the input end 12 and the potential ignition source 14, so that the temperature fuse FUt is even closer to the plastic case 2. Therefore, a distance Y between the potential ignition source 14 and the thermal fuse FUt cannot usually be kept at a minimum distance of 8 mm.

Since the distance between the potential ignition source 14 of the power supply device 100 and the inner surface of the plastic case 2 is inevitably less than 13 mm, the plastic case 2 with the fire resistance level of V-0 needs to be used to meet the safety standards. Moreover, the power supply device 100 of the present disclosure further includes inorganic material 3, and the inorganic material 3 is configured between the potential ignition source 14 and the inner surface of the corresponding position of the plastic case 2, so as to prevent the flame from burning through or spreading out of the plastic case 2 when the potential ignition source 14 is burnt out. Specifically, the inorganic material 3 may be materials such as asbestos, mica, diamond, graphite, crystal, etc., which mainly do not contain carbon. Therefore, at an instant high temperature of 600° C.-700° C., the material itself does not undergo carbonization or embrittlement, so there is no risk of the flames burning through or spreading out from places where these structures are damaged by carbonization (or embrittlement). Among them, a Flame Barrier (FRB) series material developed by 3M Company is the most preferable for inorganic material 3, which is mainly suitable for insulating sheets for original equipment manufacturer (OEM) electrical flame-resistant applications. The major portion of the product is mainly inorganic material 3 with good flame resistance and dielectric strength, and with a fire resistance level UL 94 5VA.

In addition, the remaining potential ignition source 14 (for example but not limited to, at last one power switch) inside the power supply device 100 is usually configured in other positions on the circuit board 1A. Since the remaining potential ignition source 14 do not have to be configured at the input end 12 or close to the input end 12, the remaining potential ignition source 14 can usually keep the minimum distance of more than 13 mm from the plastic case 2. However, if the remaining potential ignition source 14 cannot keep a minimum distance of more than 13 mm from the plastic case 2, the inorganic material 3 can also be configured between the remaining potential ignition source 14 and the plastic case 2, so as to prevent the flame from burning through or spreading out of the plastic case 2 when the power supply device 100 is burn out.

Referring again to FIG. 3, since the potential ignition source 14 (refers here to the varistor) is located on the side of the circuit board 1A and very close to the plastic case 2, the distance between the potential ignition source 14 and the inner surface of the plastic case 2 is less than an isolation distance X. According to the safety standards IEC 62368-1, the isolation distance X is less than 13 mm. Since the power supply device 100 of the present disclosure is provided with the inorganic material 3 between the potential ignition source 14 and the plastic case 2, the risk of the flames burning through or spreading out due to instantaneous high temperature can be avoided. Therefore, under the condition that the isolation distance X is less than 13 mm, the power supply device 100 may be still conform to safety standards.

Figure 6C:
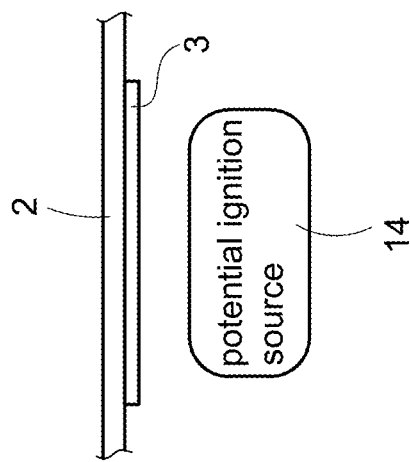
FIG. 6C is a schematic diagram of the configuration of the inorganic material according to a third embodiment of the present disclosure.
Figure 6B:
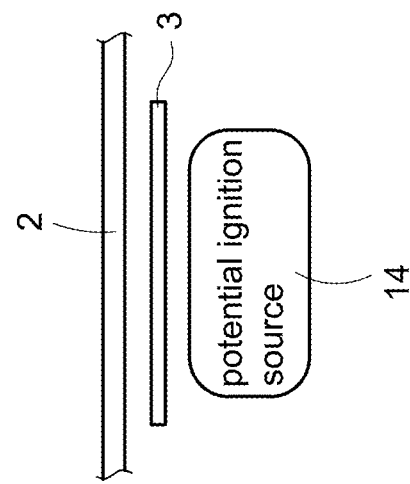
FIG. 6B is a schematic diagram of the configuration of the inorganic material according to a second embodiment of the present disclosure.
Figure 6A:
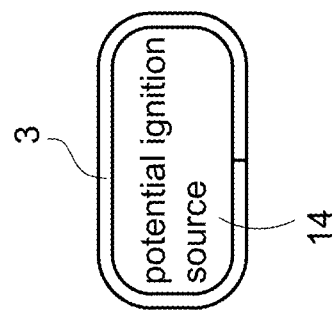
FIG. 6A is a schematic diagram of the configuration of an inorganic material according to a first embodiment of the present disclosure.

Please refer to FIG. 6A, which shows a schematic diagram of the configuration of an inorganic material according to a first embodiment of the present disclosure, FIG. 6B shows a schematic diagram of the configuration of the inorganic material according to a second embodiment of the present disclosure, FIG. 6C shows a schematic diagram of the configuration of the inorganic material according to a third embodiment of the present disclosure, and also refer to FIGS. 3-5. In FIG. 6A, the inorganic material 3 may be designed as a flexible sticker such as but not limited to adhesive tape, and wrapped around the outer surface of the potential ignition source 14 in a winding manner, so as to block the flame generated by the potential ignition source 14, and prevent carbonization due to high temperature. The number of turns wound by the inorganic material 3 is not limited. In FIG. 6B, the inorganic material 3 may be designed as a baffle and configured between the potential ignition source 14 and the inner surface. It may also be used to block the flame generated by the potential ignition source 14, and prevent carbonization due to high temperature. Preferably, the width of the inorganic material 3 may be designed to be greater than the potential ignition source 14 to provide a better barrier effect. In FIG. 6C, the inorganic material 3 may be designed as a sticker (it may be a flexible or inflexible sticker), and it is attached to the inner surface of the plastic case 2 corresponding to a location of the potential ignition source 14, so as to block the flame generated by the potential ignition source 14, and prevent carbonization due to high temperature. Therefore, the configuration of FIGS. 6A-6C may prevent the plastic case 2 from generating a condition of the large-area burn through. Likewise, the width of the inorganic material 3 in FIG. 3 may be designed to be greater than the potential ignition source 14 to provide a better barrier effect.

It is worth mentioning that, in one embodiment of the present disclosure, the inorganic material 3 of FIGS. 6A-6C only shows a partial configuration direction. However, in practical applications, the generally configurable positions of the inorganic material 3 may include the front, rear, left, right, and upper sides of the potential ignition source 14, which is determined according to the isolation distance X between the potential ignition source 14 and the inner surface. The lower side is adjacent to the circuit board 1A, which may be configured according to the situation.

Figure 7:
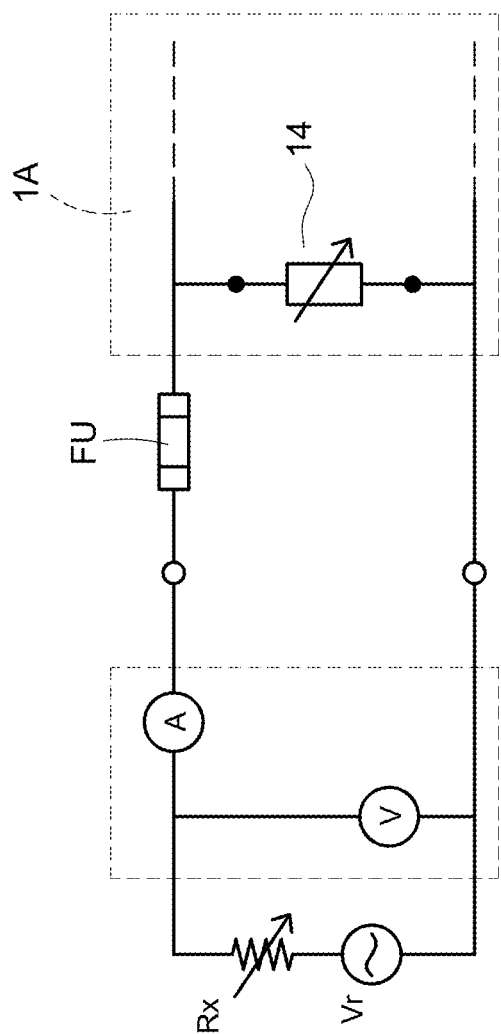
FIG. 7 is a wiring diagram of overload test method.

Further, through the configuration of the inorganic materials 3 in FIGS. 6A-6C, the present disclosure is subject to IEC 62368-1:2018 overload test of the safety standards as shown in FIG. 7. The test scheme shown in FIG. 7 includes a power supply device 100 to be tested and the potential ignition source 14 (refers here to the varistor), and includes a power supply Vr, a test resistor Rx, and a fuse FU for testing the power supply device 100, and includes a power meter V, A for measuring power. Moreover, Vr may be, for example but not limited to, 240V AC power supply, and overload test conditions is as follows:

The first stage, $Rx=16\times Vr(\Omega)$;
The second stage, $Rx=8\times Vr(\Omega)$;
The third stage, $Rx=4\times Vr(\Omega)$; and
The fourth stage, $Rx=2\times Vr(\Omega)$, and so on.

Figure 8:
FIG. 8 is a photograph of experimental results of the miniaturized power supply device with fire-retardant function according to a first embodiment of the present disclosure.
Figure 9:
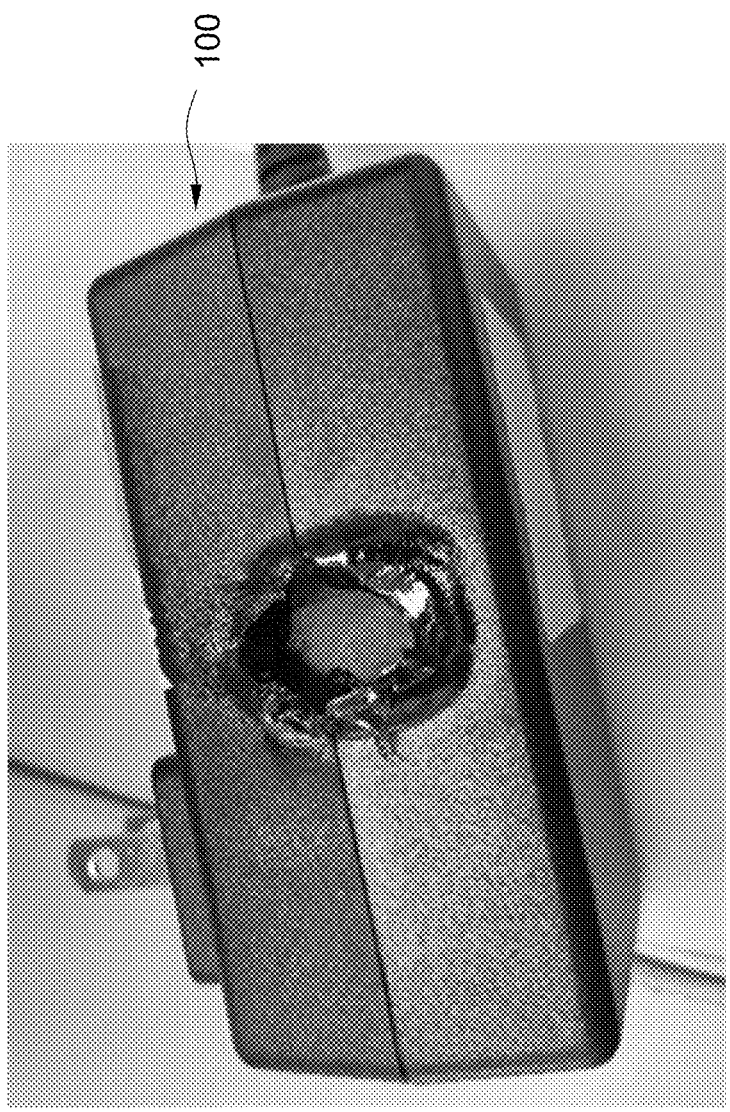
FIG. 9 is a photograph of experimental results of the miniaturized power supply device with fire-retardant function according to a second embodiment of the present disclosure.

In the above test, the test may be carried out one by one in stages, and the size of the test resistor Rx is gradually decreased according to the increment of the stages, until the varistor is burned out. After the varistor is burnt out, the plastic case 2 of the power supply device 100 is checked to confirm whether there is a large-area burn through that causes the plastic case 2 to be carbonized or embrittled. Under the above test conditions, the test results are as shown in photographs of experimental results shown in FIGS. 8-9. According to the photographs of the experimental results, under the condition that the inorganic material 3 is configured (for example, the inorganic material 3 is configured between the inner surface of the plastic case 2 and the varistor in the manner shown in FIGS. 6A-6C), the plastic case 2 does not have flames channeling before and after the overload test is completed. In addition, after the varistor is burnt out, only the plastic case 2 is melted due to high temperature, and the condition that the flame burned through or spread out is avoided. On the other hand, the remaining potential ignition source 14 (for example but not limited to, at last one power switch) inside the power supply device 100 are also applicable to the aforementioned tests, and have similar effects, and is not be repeated here.

Therefore, in summary, the main purpose and effect of the present disclosure is to arrange inorganic material 3 between the potential ignition source 14 and the case 2, the problem of flame burning through or spreading out when the potential ignition source 14 burns out can be suppressed, even under the condition that it is difficult for the potential ignition source 14 (for example but not limited to the varistor disclosed in this disclosure) of the miniaturized power supply device 100 to maintain a safe isolation distance X from the plastic case 2.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A power supply device, comprising:
a conversion module, comprising:
an input end configured to receive an input source,
a potential ignition source coupled to an input end to suppress a surge of the input source,
a conversion circuit coupled to the potential ignition source, and configured to convert the input source into an output source, and
an output end configured to provide the output source to the load,
a plastic case accommodating the conversion module, and the plastic case comprising an inner surface, and
an inorganic material configured between the potential ignition source and the inner surface of the plastic case,
wherein a distance between the potential ignition source and the inner surface is less than 13 mm.

2. The power supply device as claimed in claim 1, wherein the potential ignition source is a surge absorption unit.

3. The power supply device as claimed in claim 1, wherein the inorganic material is a sticker, and is flexibly wrapped around the potential ignition source.

4. The power supply device as claimed in claim 1, wherein the inorganic material is a baffle, and is configured between the potential ignition source and the inner surface.

5. The power supply device as claimed in claim 1, wherein the inorganic material is a sticker, and is attached to the inner surface of the plastic case.

6. The power supply device as claimed in claim 1, wherein the power supply device complies with an overload test of IEC 62368-1:2018 of international safety standards.

7. The power supply device as claimed in claim 1, further comprising:
a thermal fuse coupled in series with the potential ignition source,
wherein a distance between the thermal fuse and the potential ignition source is less than 8 mm.

8. The power supply device as claimed in claim 1, wherein a fire resistance level of the inorganic material is UL 94 5VA.

9. The power supply device as claimed in claim 1, wherein the inorganic material is a material of FRB series.

* * * * *